United States Patent

Murtha, Jr. et al.

[11] Patent Number: 5,977,762
[45] Date of Patent: Nov. 2, 1999

[54] LIGHTNING DETECTION APPARATUS AND METHODOLOGY

[75] Inventors: John B. Murtha, Jr., Wading River; William H. Skinner, II, Ridge, both of N.Y.

[73] Assignee: Mirage Lighting Technology Ltd, Middle Island, N.Y.

[21] Appl. No.: 08/979,760

[22] Filed: Nov. 26, 1997

[51] Int. Cl.⁶ ...................................................... G01R 31/02
[52] U.S. Cl. ............................ 324/72; 324/457; 340/601; 702/4
[58] Field of Search .............................. 324/72, 452, 457, 324/72.5; 340/601; 73/170.16, 170.24; 702/4; 342/26, 460

[56] References Cited

U.S. PATENT DOCUMENTS

| | | | |
|---|---|---|---|
| 4,115,732 | 9/1978 | Krider et al. | 324/72 |
| 4,198,599 | 4/1980 | Krider et al. | 324/72 |
| 4,806,851 | 2/1989 | Krider et al. | 324/72 |
| 4,823,115 | 4/1989 | McCallie | 340/601 |
| 4,912,459 | 3/1990 | McCallie | 340/601 |
| 5,083,042 | 1/1992 | Merchant | 340/601 |
| 5,305,210 | 4/1994 | Kuzma et al. | 364/420 |
| 5,448,161 | 9/1995 | Byerley, III | 324/72 |
| 5,657,197 | 8/1997 | Skinner, II | 361/117 |

*Primary Examiner*—Diep N. Do
*Attorney, Agent, or Firm*—William L. Botjer

[57] ABSTRACT

Apparatus and methodology for detection of lightning. The invention includes an antenna and amplifier for receiving the electrostatic and/or electromagnetic discharges of lightning and electrical noise and outputs an analog electrical signal representative of the discharge. The analog signal is applied to a threshold detection circuitry whose output is activated when the input signal rises above a predetermined level. The output of the threshold circuitry is a series of pulses of varying length. A computer or other programmable device is connected to the output of the threshold circuitry and opens an event window when the first pulse is received and determines the number of pulses received and the total duration of the pulses during the event window. The number and total duration of the pulses is compared to stored pulse signatures of lightning discharges and man made electrical noise. If the pulse signature correlates with that of lightning an alert signal is generated, if the signature correlates with that of man made noise no alert is generated and the event window is reset. The generation of a first alert may be used to change the length of the event window or other parameters to change sensitivity and/or to generate various levels of alerts.

16 Claims, 4 Drawing Sheets

LIGHTNING INDUCED NOISE TYP

MAN MADE SWITCHING NOISE TYP

LIGHTNING DETECTION APPARATUS AND METHODOLOGY

BACKGROUND AND SUMMARY OF THE INVENTION

This invention relates to lightning detectors and particularly to detectors which are relatively simple and easy to install, yet are resistant to false triggering by man made electrical noise.

The destructive power of lightning is well known, at best a lightning strike is disruptive of normal activities, at worst a lightning strike can cause severe property damage, personal injury and death. The ability to reliably detect lightning discharges at a distance, so that a warning can be sounded or preventative action undertaken has been desired for many years. Lightning discharges are accompanied by electrostatic and electromagnetic fields which can be detected at distance. Accordingly many systems for lightning detection detect these electromagnetic phenomenon. The problem with lightning detectors that use the detection of the electrostatic and electromagnetic phenomena to detect a lightning discharge is not that they don't detect lightning, they do, the problem is they detect many other man made electrical noise and falsely interpret the noise as a lightning discharge. A wide variety of appliances and equipment used in the home and industry are capable of generating electrical noise that can falsely trigger a lightning detector. Electric motors, solenoids, welders, florescent lighting ballasts and stove ignitors are only some of the devices that can provide the requisite electromagnetic discharge to falsely trigger a lightning detector.

Electrical circuitry capable of detecting lightning discharges is shown in U.S. Pat. Nos. 4,823,115 and 4,912,459 to McCallie and U.S. Pat. No. 5,083,042 to Merchant. However, the circuits shown in these patents while capable of lightning detection contain no effective means of preventing false triggering. One solution to this problem has been to recommend that the detector be remotely mounted outdoors and not be connected to house current (through which electrical noise is transmitted) which adds to cost and complexity and does not fully prevent the device from falsing. Another solution to false detection is through the use of multiple electrical and magnetic antennas whose signals are combined and processed to provide accurate lightning detection. Such multiple detectors are shown in U.S. Pat. Nos. 4,115,737; 4,198,599 and 4,806,851 to Krider et al. However the circuitry needed to process multiple detectors is complex and removes such detectors from consideration for use in the home. In U.S. Pat. No. 5,448,161 a photodiode used to detect a lightning flash is used in conjunction with an electromagnetic detector to accurately detect a lightning discharge. However this is also relatively complex and requires that the photodiode be mounted so that it has an unobstructed sky view, which is not possible in many locations. An extremely complex lightning detection system suitable for use in aircraft is shown in U.S. Pat. No. 5,305,210 and related patents. This system uses digital signal processing to analyze input lightning waveforms in a lightning warning. Such an approach is of course is far too expensive for general commercial or home applications.

The present invention provides apparatus and methodology for lightning detection that uses relatively simple and hence reliable circuitry. A device following the teachings of the present invention does not respond to common household and industrial noise. Despite the fact the most electrical noise that can falsely trigger lightning detectors is carried by the electrical lines, the present apparatus can be powered by household power. Apparatus constructed in accordance with the present invention does not require remotely mounted antennas or multiple antennas. This enables the present device to be constructed as a single unit thus reducing expense. The present device is capable of adjusting its own sensitivity when distant lightning discharges have been detected and is capable of triggering multiple levels of precautionary steps as lightning approaches.

The present invention includes apparatus and methodology for detection of lightning and is resistant to man made electrical noise. The invention includes an antenna and amplifier for receiving the electrostatic and/or electromagnetic discharges of lightning and electrical noise and outputs an analog electrical signal representative of the discharge. The analog signal is input to a threshold detection circuitry whose output is activated when the input signal rises above a predetermined level. The output of the threshold circuitry is a series of pulses of varying length. A computer or other programmable device is connected to the output of the threshold circuitry and opens an event window when the first pulse is received. The number of pulses received and the total duration of the pulses is determined during the event window. The number and total duration of the pulses is compared to stored pulse signatures of lightning discharges and man made electrical noise. If the pulse signature correlates with that of lightning an alert signal is generated, if the signature correlates with that of electrical noise no alert is generated and the event window is reset. The generation of a first alert may be used to change the length of the event window or other parameters to change sensitivity and/or to generate various stages of alerts. In addition to the generation of an alert, the apparatus may be used to trigger a precautionary action such as the raising of lightning rods by equipment such as that shown in our U.S. Pat. No. 5,657,197 issued Aug. 12, 1997.

BRIEF DESCRIPTION OF THE DRAWINGS

For a better understanding of the invention, reference is made to the following drawings which are to be taken in conjunction with the detailed description to follow in which.

DESCRIPTION OF THE PREFERRED EMBODIMENTS

Figure 1:
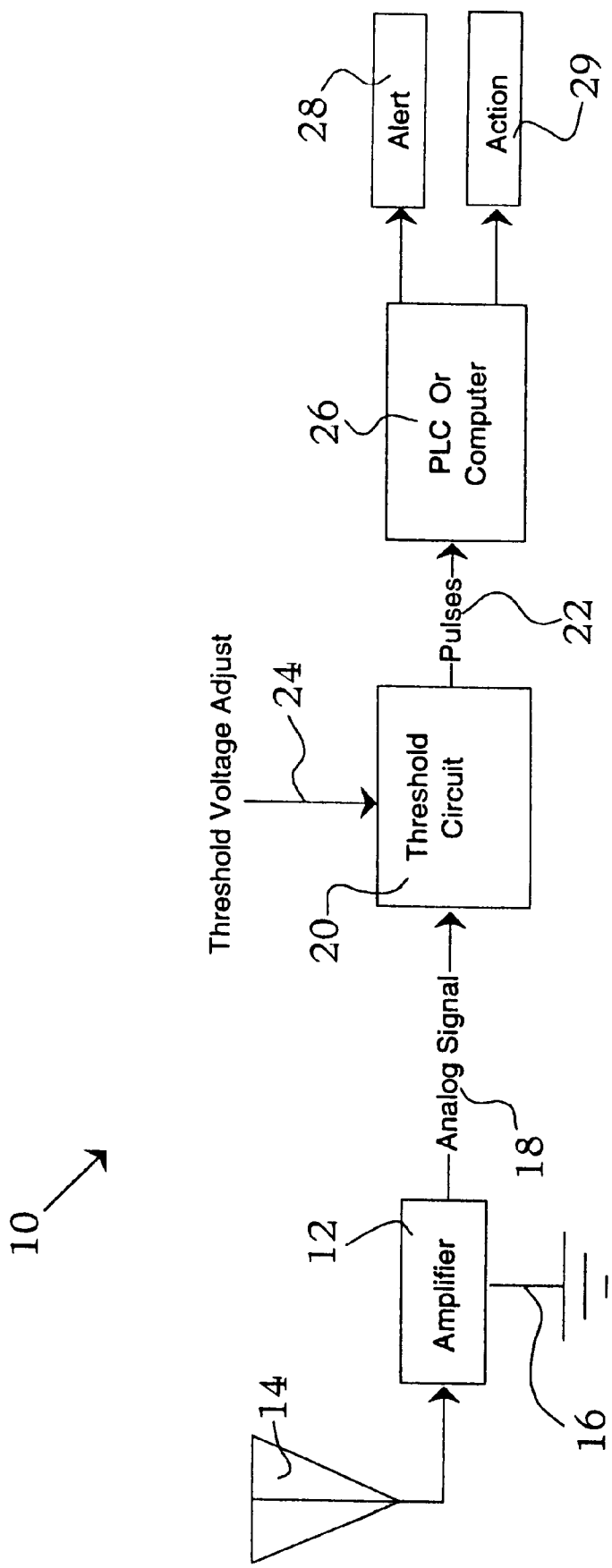
FIG. 1 is a block diagram of the lightning detection apparatus of the present invention.

FIG. 1 is a block diagram of the apparatus for carrying out the present invention. Lightning detection apparatus 10 includes an amplifier 12 connected between an antenna 14 and a ground connection 16. Amplifier 12 is one of the many available high current gain amplifiers which is used to amplify the electrostatic and/or electromagnetic discharge that accompanies lightning and man made electrical noise. The output 18 of amplifier 12 is an analog waveform (usually on the order of a 100 to 2000 millivolts) corresponding to the lightning discharge. Output 18 of amplifier 12 is connected to a threshold circuit 20 which converts the analog signal of amplifier 12 to a series of pulses of varying length. Threshold circuit 20 is a commercially available integrated circuit; an LM311N comparator. If the particular threshold circuit 20 used has sufficient gain the need for a separate amplifier 12 could be eliminated. The output 22 of threshold circuit 20 goes high only when the amplitude of the input analog waveform is above the preset threshold of circuit 20 the level of which is set by a threshold adjustment 24. Thus a short pulse is generated at output 22 when the analog signal from amplifier 12 is above the preset voltage threshold for a short amount of time and a longer pulse when the analog signal is above the threshold for a longer time. The output 22 of threshold circuit 20 is applied to a programmable logic controller 26 (or computer) which processes the pulses as will be described in detail below, to determine whether the output pulses are indicative of a lightning discharge, in which case one or more alert indicators 28 will be activated and/or actions taken, or man made electrical noise.

Figure 2:
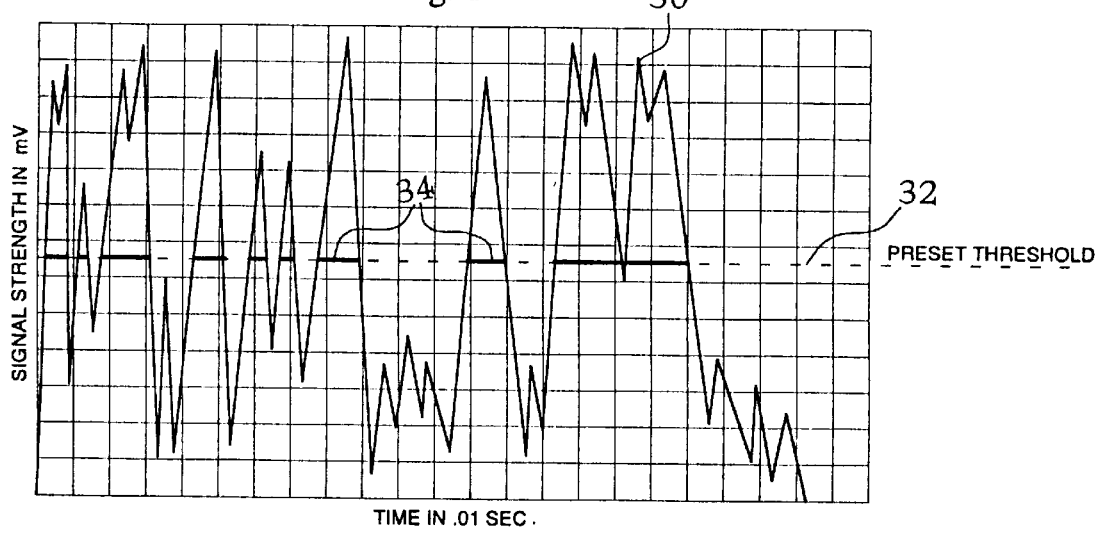
FIG. 2 is a graphical representation of the input of threshold circuit of the present invention, in comparison to its output, in response to a lightning discharge.

FIG. 2 is a graphical representation of the input of threshold circuit 20 in comparison to the output 22. The horizontal axis of FIG. 2 represents time and vertical axis represents the amplitude (in millivolts) of the analog output of amplifier 12. Line 30 of FIG. 2 is the output of amplifier 12 which is input to threshold circuit 20 and represents a lightning discharge. Horizontal line 32 represents the preset threshold as set by control 24. The series of horizontal pulses 34 represent the output 22 of threshold circuit 20. As is seen there is an output from circuit 20 only when the voltage level of line 30 exceeds that of threshold 32. Thus the output of circuit 20 is a series of generally unequal length pulses. By increasing or decreasing the threshold voltage 32 of threshold circuit by means of control 24, the range at which lightning is detected can be altered. When threshold voltage is adjusted to a high level the range of lightning that is detected can be reduced to 5 to 10 miles. Conversely, when threshold voltage 32 is reduced to a low level, the range at which lightning is sensed can be increased to 100 to 130 miles.

Figure 3:
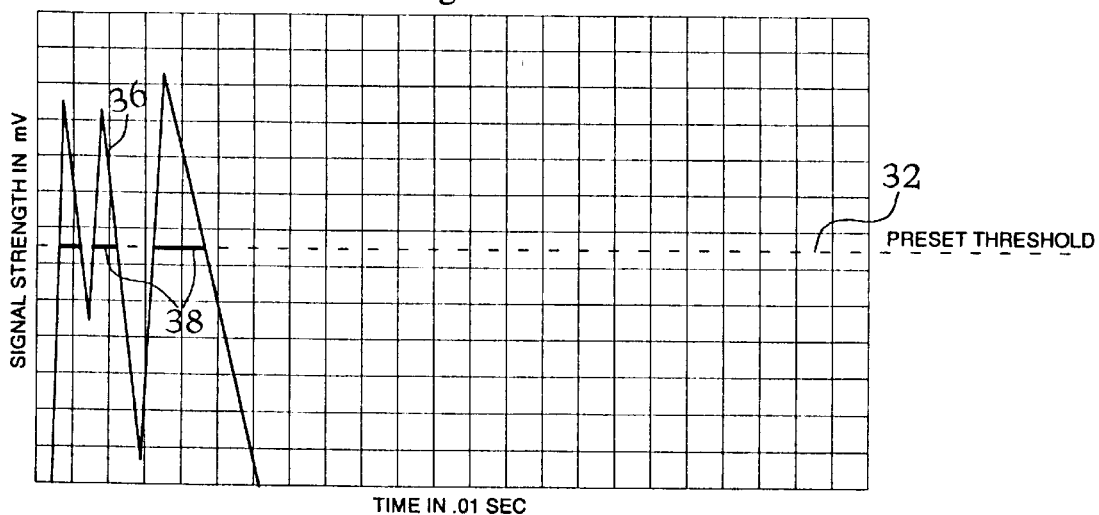
FIG. 3 is a graphical representation of the input of threshold circuit of the present invention, in comparison to its output, in response to man made electrical noise.

FIG. 3 is similar to that of FIG. 2 but with the output waveform 36 of man made switching noise (as output from amplifier 12) plotted thereon. Pulses 38 represent the output 22 of threshold circuit 20 in response to input waveform 36. As is clearly illustrated the pulses 34 from a lightning discharge are distinct from those 38 generated by man made noise. It is seen that there are fewer pulses 38 than pulses 34 and that the total length (duration) of pulses 34 is less than that of pulses 38. The actual processing of the pulse "signatures" 34, 38 is described below.

Figure 4:
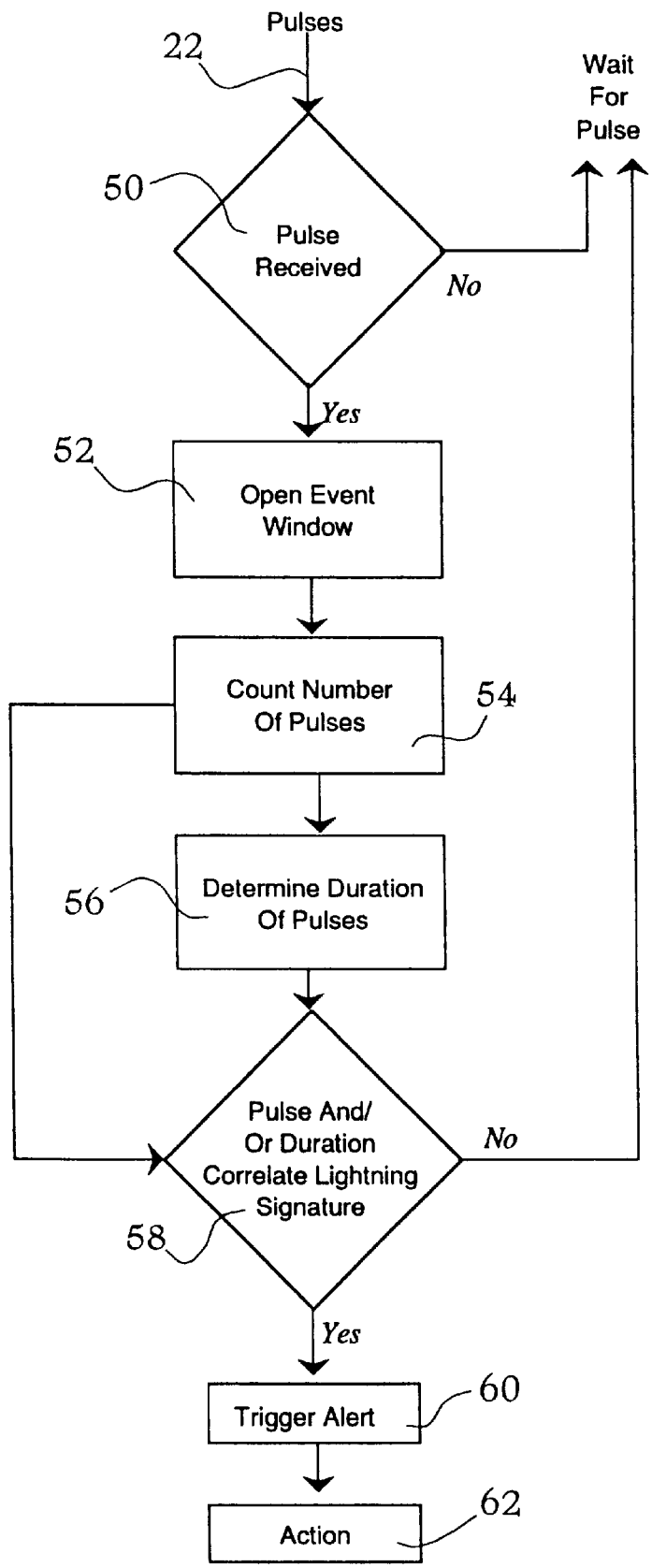
FIG. 4 is a flow chart illustrating a first embodiment of the programming of the present invention for distinguishing a lightning discharge from man made noise and the actions generated thereby.

FIG. 4 is a flow chart depicting the processing of the pulses 22 output from threshold circuit 20 in order to determine if a lightning discharge has occurred. At block 50 it is determined if a pulse 22 has been received, if not no action occurs and the processing awaits the receipt of a pulse 22. If a pulse 22 has been received processing continues to block 52 where an "event window" of a predetermined time period T1 will be opened, a representative event window T1 for lightning detection is on the order of two seconds. Thereafter processing proceeds to block 54 where the total number of pulses 22 received during the event window T1 will be counted. At block 56 the total duration of all of the pulses 22 received during the event window T1 is determined. The output of block 54 (number of pulses) and block 56 (total duration of pulses) is applied to block 58 to determine whether the number of pulses received and the total duration of the pulses correlate with a lightning discharge (as described below) if a correlation with a lightning discharge is found processing continues to block 60, where an alert will be triggered to indicate that a lightning discharge has been detected. Thereafter processing proceeds to block 62 where an action based on the detection of lightning may be taken (such as the raising of lightning rods or the activation of an emergency generator) then the event window will be reset at block 52 to await another triggering event. If at block 58 the number of pulses and their total duration correlate to man made phenomenon no alert will be triggered and the event window will be reset.

The use of both the number of pulses output by threshold circuit 20 and their total duration to determine whether the pulse signature is representative of lightning discharge is important in preventing false positive triggering of an alert. As is seen in a comparison of FIG. 2 (which shows a characteristic lightning discharge in pulses 34) and FIG. 3 (which shows pulses 38 characteristic of man made electrical noise) a lightning discharge generally has both a larger number of pulses and a longer total duration of pulses than does man made noise. Table A below shows the correlation of number of pulses and total duration to the observed phenomenon. Here the signature of pulses 34 of FIG. 2 is shown as example A below with 10 pulses and a total duration of 13 (arbitrary units of time) with the signature of pulses 38 of FIG. 3, example E below, 3 pulses with a total duration of 9 time units.

TABLE A

| Example | Pulses | Duration | Correlation |
| --- | --- | --- | --- |
| A | 10 | 13 | Lightning |
| B | 49 | 4 | Lightning |
| C | 64 | 24 | Lightning |
| D | 3 | 49 | Lightning |
| E | 3 | 9 | Electrical Noise |
| F | 4 | 2 | Electrical Noise |
| G | 2 | 5 | Electrical Noise |

As is shown in table A lightning discharges generally have a greater number of pulses and total duration exceed those of electrical noise. However, this is not always the case. Examples B and D illustrate pulse signatures of lightning that could be misinterpreted as electrical noise if only the pulse count or the total duration was used as the sole determining criteria. Example B which has a large number of pulses but a small total duration of the pulses (similar to electrical noise) represents a severe lightning storm at a great distance while example D which has a large total duration but a small number of pulses (also similar to electrical noise) represents a lightning storm that is very close by. Accordingly, suitable programming to accommodate examples B and D would output a lightning warning if either the pulse count or the duration exceeded a predetermined minimum. Hence, reliable lightning detection can be had by comparing both the number of pulses and the total duration of the pulses to predetermined criteria of lightning and electrical noise.

Figure 5:
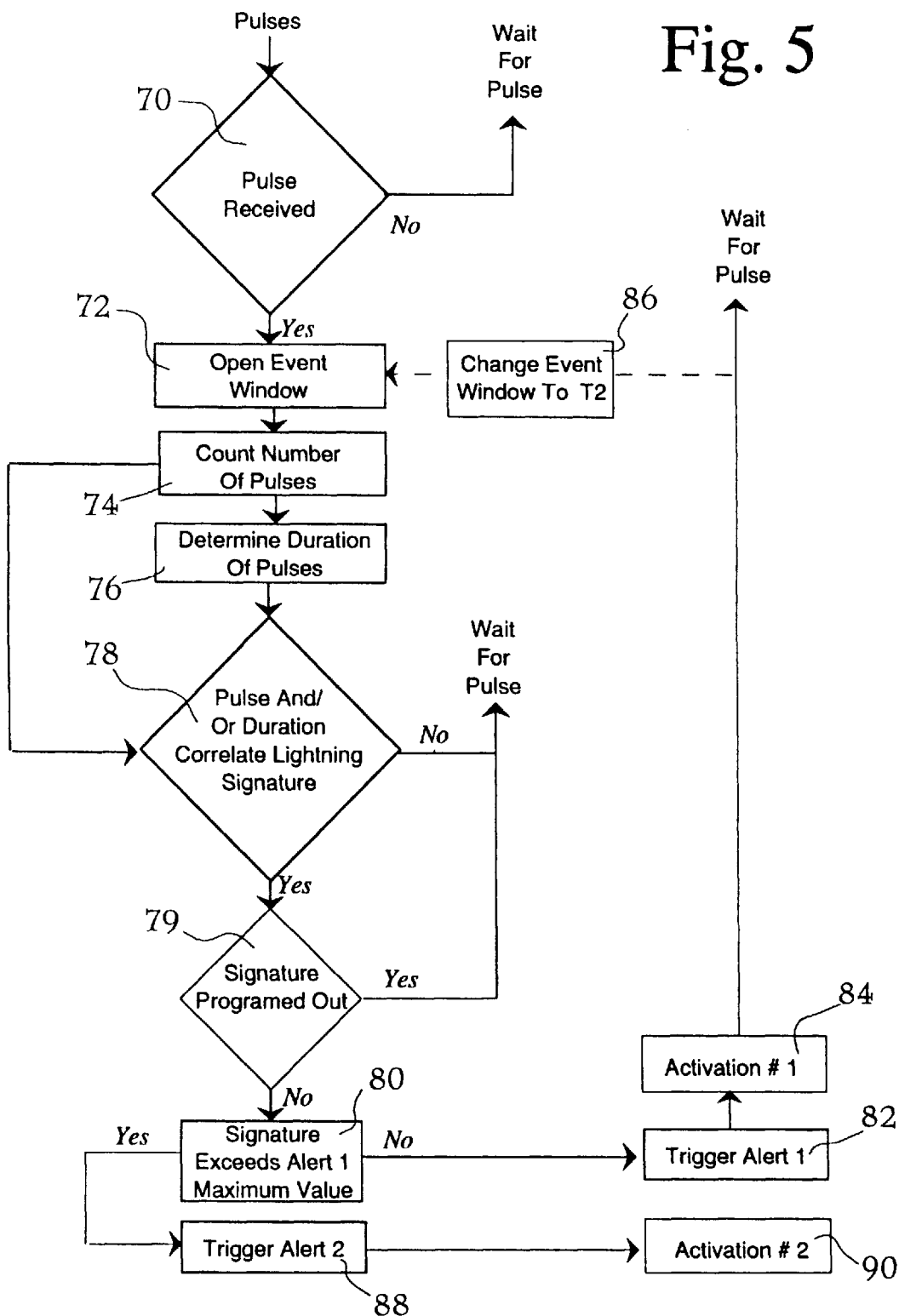
FIG. 5 is a flow chart illustrating a second multiple alert level embodiment of the programming of the present invention for distinguishing a lightning discharge from man made noise and the actions generated thereby.

FIG. 5 is a flow diagram of a second embodiment of programming of the present invention in which the alert triggering can be changed dynamically after a first detection of a lightning discharge. At block 70 it is determined if a pulse 22 has been received, if not no action occurs and process awaits the receipt of a pulse 22. If a pulse 22 has been received processing continues to block 72 where an "event window" of a first predetermined time period T1 will be opened, a representative first event window T1 for lightning detection is on the order of two seconds. Thereafter processing proceeds to block 74 where the total number of pulses 22 received during the event window T1 will be counted. At block 76 the total duration of all of the pulses 22 received during the event window T1 is determined. The output of block 74 (number of pulses) and block 76 (total duration of pulses) is applied to block 78 to determine whether both the number of pulses received and the total duration of the pulses correlate with a lightning discharge (as described above) if a correlation with a lightning discharge is found processing continues to block 79, to this point the processing of FIG. 4 and FIG. 5 are identical.

The use of pulse count and total duration signatures as the deciding criteria that are programed in the controller permits an individual unit to be optionally "customized" for a particular location. If it is found that a particular device emits electrical noise that is misinterpreted as correlating to a lightning discharge, the pulse and duration signature of that particular device may be programmed into the controller with the controller programmed to ignore that particular signature as an indication of a lightning discharge. This is shown in block 79 where, it is determined if the particular pulse signature, which has previously found to correlate with a lightning discharge, has been "programmed out". If the particular signature has been programmed out, no alert will be triggered and processing will return to await the receipt of further pulse signatures to be processed. If the pulse signature has not been programmed out at block 79 processing will continue to block 80.

At block 80 a determination is made as to whether the pulse signature exceeds a value that indicates that the detected lightning discharge is that of a close by storm, if not (e.g. that the detected discharge is representative of a distant discharge) processing continues to block 82 where a first alert is triggered. The first alert may be simply in the form of a warning light or sound that a possibly distant lightning discharge has been detected. Processing thereafter proceeds to block 84 where a first action may be taken, the first action may be, by way of example, be the starting of an emergency generator. Processing then continues to block 86 where the event window is changed to a time T2 which is different from that of time T1. The event window T2 is sent to block 72 where the event window is reset to await receipt of further pulses 22 which arrive during the new event window T2 which are then processed at blocks 74,76 and 80. If at block 80 the pulse signature exceeds the alert one minimum value where a second level alert (block 88) and second level activation (block 90), as described below, will be immediately triggered.

A suitable time T2 is one half second where T1 is two seconds, a half second event window will increase the accuracy of lightning detection. This is due to the fact that after storms begin to produce more than 15 to 30 strikes per minute, pulses from several strikes will occur in the same two second event window which causes the lightning sensing range to increase by a factor of 1.5 (when threshold control 24 is set for a range of 60–100 miles) to 3.0 (when threshold control 24 is set to under 25 miles). For increased accuracy it is desirable to change the event window to on the order of 0.5 seconds.

In FIG. 5 after the event window is set to T2, blocks 74 and 76 will count the number of pulses and their total duration during event window T2 and if a correlation with lightning is found at block 78 processing proceeds to block 79 where it is again determined whether the particular pulse signature has been "programmed out", if the signature has not been programmed out processing proceeds to block 80. At block 80 it is determined if the signature exceeds the value for a close by lightning strike and if it does, the program will branch to block 88. At block 88 a second (higher) level alert will be triggered indicating a closer or more imminent lightning strike. Processing thereafter proceeds to block 90 where a second level of action may be taken. By way of example, if the first level of action triggered at block 84 was the starting of auxiliary generating equipment the second level of action triggered at block 90 could be the switching of a building from external power to the auxiliary generators.

Many different types of programmable computers and controllers may be used to carry out the processing steps of FIGS. 4 and 5. A device called a "programmable logic controller" (PLC) manufactured by a variety of companies which includes a number of timers, counters and controllers and is programmable in a language called "ladder logic" has been found to be well suited for this application. However any other programmable device from an application specific integrated circuit to a standard stored program computer may also be used. Great processing power is not needed to carry out the present invention which keeps the device inexpensive. The PLC or computer, by calculating the rate of increase of the pulses and/or duration can also calculate the rate of approach of the storm and thus output a suitable warning.

The invention has been described with respect to preferred embodiments. However, as those skilled in the art will recognize, modifications and variations in the specific details which have been described and illustrated may be resorted to without departing from the spirit and scope of the invention as defined in the appended claims.

What is claimed is:

1. Lightning detection apparatus comprising:
    a) antenna means for receiving the electrostatic and/or electromagnetic discharge of lightning and man made electrical noise;
    b) amplifier means connected between the antenna means and a ground for providing an analog electrical signal representative of the discharge;
    c) threshold circuit means for converting said analog electrical signal into a series of electrical pulses, the number of said pulses being determined by the number of times the analog signal crosses a predetermined amplitude threshold, the duration of each of said pulses being determined by the amount of time the analog signal exceeds said predetermined threshold;
    d) timer means for setting an event window for a period of time T1, when a pulse has been generated;
    e) means for determining the number of pulses generated during the time period T1;
    f) means for determining the total duration of all of the pulses during the time period T1;
    g) means for comparing the number and total duration of the pulses to previously stored criteria representative of lightning discharges and man made electrical sources;
    h) means for outputting an alert signal when the number and total duration of the pulses correlate with the predetermined criteria for a lightning discharge; and
    l) means for resetting the event window to await the output of a further series of pulses when the number and total duration of the pulses correlate with the predetermined criteria for man made electrical noise.

2. Apparatus for lightning detection as claimed in claim 1, further including means to adjust the predetermined threshold amplitude of the threshold circuitry so as to adjust the range of lightning detection.

3. Apparatus for lightning detection as claimed in claim 1, further including means for changing the event window to a time period T2 after an alert signal has been output so as to alter the accuracy of the lightning detection.

4. Apparatus for lightning detection as claimed in claim 3, wherein time period T2 is shorter than that of time period T1.

5. Apparatus for lightning detection as claimed in claim 1, wherein the means for comparing the number of pulses to the stored criteria includes the means for determining whether the number of pulses exceeds the stored criteria.

6. Apparatus for lightning detection as claimed in claim 1, wherein the means for comparing the total duration of the pulses to the stored criteria includes means for determining whether the total duration of the pulses exceeds the stored criteria.

7. Apparatus for lightning detection as claimed in claim 1, further including means for activating an external device when an alert signal has been generated.

8. Apparatus for lightning detection as claimed in claim 1, wherein the timer means, determining means and comparing means comprise a programmable logic controller.

9. Apparatus for lightning detection as claimed in claim 1, further including means for activating a first function when an alert signal has first been generated and for activating a second function after a second alert has been generated.

10. Apparatus for lightning detection as claimed in claim 9, further including means for changing the event window to a time period T2 which is shorter than the time period T1 after an alert signal has first been generated.

11. Apparatus for lightning detection as claimed in claim 1, further including means for comparing said number and duration of pulses to previously stored criteria of electrical noise peculiar to a particular location so as to override a lightning alert signal.

12. A method for lightning detection while avoiding false triggering, said method comprising the steps of:

a) providing an analog electrical signal representative of discharges that accompany lightning and man made electrical noise;

b) converting said analog electrical signal into a series of electrical pulses, the number of said pulses being determined by the number of times the analog signal crosses a predetermined amplitude threshold, the duration of each of said pulses being determined by the amount of time the analog signal exceeds said predetermined threshold;

c) setting an event window for a period of time T1, when a pulse has been generated;

d) determining the number of pulses generated during the time period T1;

e) determining the total duration of all of the pulses during the time period T1;

f) comparing the number and total duration of the pulses to previously stored criteria representative of lightning discharges and man made electrical sources;

g) outputting an alert signal when the number and total duration of the pulses correlate with the predetermined criteria for a lightning discharge; and h) resetting the event window to await the output of a further series of pulses when the number and total duration of the pulses correlate with the predetermined criteria for man made electrical noise.

13. The method for lightning detection as claimed in claim 12, further including the step of changing the event window to a time period T2 after an alert signal has been output so as to alter the sensitivity of the lightning detection.

14. The method for lightning detection as claimed in claim 13, wherein time period T2 is shorter than that of time period T1.

15. The method for lightning detection as claimed in claim 12, wherein the step of comparing the number of pulses to the stored criteria includes the step of determining whether the number of pulses exceeds the stored criteria.

16. The method for lightning detection as claimed in claim 12, wherein the step of comparing the total duration of the pulses to the stored criteria includes the step of determining whether the total duration of the pulses exceeds the stored criteria.

* * * * *